United States Patent
Osuga et al.

(10) Patent No.: US 7,560,821 B2
(45) Date of Patent: Jul. 14, 2009

(54) AREA MOUNT TYPE SEMICONDUCTOR DEVICE, AND DIE BONDING RESIN COMPOSITION AND ENCAPSULATING RESIN COMPOSITION USED FOR THE SAME

(75) Inventors: Hironori Osuga, Tochigi (JP); Takashi Yagisawa, Tochigi (JP); Hiroyuki Yasuda, Tochigi (JP)

(73) Assignee: Sumitomo Bakelite Company, Ltd (JP)

( * ) Notice: Subject to any disclaimer, the term of this patent is extended or adjusted under 35 U.S.C. 154(b) by 423 days.

(21) Appl. No.: 11/386,216

(22) Filed: Mar. 22, 2006

(65) Prior Publication Data

US 2006/0226525 A1  Oct. 12, 2006

(30) Foreign Application Priority Data

Mar. 24, 2005  (JP) .............................. 2005/085279

(51) Int. Cl.
*H01L 23/29* (2006.01)
(52) U.S. Cl. ...................... 257/788; 257/778; 257/787
(58) Field of Classification Search ................ 257/778, 257/779, 781, 782, 783, 787, 788
See application file for complete search history.

(56) References Cited

U.S. PATENT DOCUMENTS

2002/0047213 A1  4/2002  Komiyama et al.
2002/0193519 A1*  12/2002  Takano et al. ................ 525/100
2004/0021231 A1*  2/2004  Ishimura et al. .............. 257/777
2005/0248039 A1*  11/2005  Miura et al. .................. 257/779

FOREIGN PATENT DOCUMENTS

| JP | 2000-302842 | 10/2000 |
| JP | 2001-123013 | 5/2001 |
| JP | 2002-284961 | 10/2002 |
| WO | WO 98/15975 | 4/1998 |

\* cited by examiner

*Primary Examiner*—Phuc T Dang
(74) *Attorney, Agent, or Firm*—Smith, Gambrell & Russell

(57) ABSTRACT

An area mount type semiconductor device having high reliability when a semiconductor element is mounted on a surface with the use of a lead-free solder, and a die bonding resin composition and encapsulating resin composition used for the area mount type semiconductor device attainable by an area mount type semiconductor device mounting a semiconductor element or a stacked element comprising a substrate, and a semiconductor element mounted on a surface of the substrate via a die bonding resin composition, and substantially having only the surface of the substrate mounting the semiconductor element encapsulated with the use of an encapsulating resin composition, wherein an elastic modulus of a cured product of the die bonding resin composition at 260° C. is 1 MPa to 120 MPa, an elastic modulus of a cured product of the encapsulating resin composition at 260° C. is 400 MPa to 1,200 MPa, and a thermal expansion coefficient of the cured product of the encapsulating resin composition at 260° C. is 20 ppm to 50 ppm.

4 Claims, 1 Drawing Sheet

AREA MOUNT TYPE SEMICONDUCTOR DEVICE, AND DIE BONDING RESIN COMPOSITION AND ENCAPSULATING RESIN COMPOSITION USED FOR THE SAME

BACKGROUND OF THE INVENTION

1. Field of the Invention

The present invention relates to an area mount type semiconductor device, and a die bonding resin composition and encapsulating resin composition used for the same.

2. Description of the Related Art

As the electronic instruments are recently having smaller sizes and lighter weights and exhibiting higher functions in market, semiconductors (hereinafter it may be referred as an integrated circuit (IC)) are more highly integrated and surface mounting of semiconductor devices (hereinafter it may be referred as a package) is promoted. An area mount type semiconductor device is developed as a novel form of package and preference of semiconductor devices is shifting from the semiconductor device of a conventional structure to the area mount type semiconductor device. Specifically, as representative area mount type semiconductor devices, there may be the ball grid array (hereinafter referred as BGA), and the chip scale package (hereinafter referred as CSP), which has smaller size than the BGA. They are proposed so as to meet demand of the package having a greater number of pins and higher speed, of which the conventional surface mounting type semiconductor devices represented by the quad flat package (hereinafter referred as QFP) and the small outline package (SOP) are approaching the limit since the mounting method of the conventional surface mounting type semiconductor device has the electrode arrangement as a surrounding structure of an IC, thus, the electrode can only be taken from around the IC.

The area mount type semiconductor device has a structure that a semiconductor element is mounted on one surface of a substrate such as a rigid circuit board as typified by a bismaleimide triazine (hereinafter referred as BT) resin/copper foil circuit board or a flexible circuit board as typified by a polyimide resin film/copper foil circuit board, and the element mounted surface, that is, only one surface of the circuit board is molded and encapsulated with the use of a resin composition or the like. On the other surface of the element mounted surface of the board, solder balls are formed in parallel in a gird pattern or a peripheral pattern so that when the semiconductor device is mounted on a circuit board for the semiconductor device, the surface having the solder balls formed and the circuit board are bonded. The electrode arrangement of such a mounting method is a matrix structure, thus, the area having the IC mounted can be utilized to take the electrode, which is advantageous for increasing number of in-put/output terminal and downsizing. As the structure of the area mount type semiconductor device, a structure using a metal substrate such as a lead frame or the like as the substrate to mount the semiconductor element is also invented besides the above-mentioned organic circuit boards.

As mentioned above, the area mount type semiconductor device has a structure of "one surface encapsulating form", wherein only the element mounted surface of the board is encapsulated with the use of a resin composition without encapsulating the solder ball formed surface. Only occasionally, the metal substrate such as the lead frame or the like may have an encapsulating resin layer of about several tens of μm on the solder ball formed surface. However, since an encapsulating resin layer having about several hundreds of μm to several mm is formed on the element mounted surface, the metal substrate substantially has a "one surface encapsulating form". When only one surface is encapsulated, due to the inconsistency of thermal expansion and thermal shrinkage between the organic substrate or metal substrate and the cured product of the resin composition, or the curing shrinkage upon molding and curing of the resin composition, warpage is likely to be caused in the semiconductor device right after molding. Also, upon performing the solder bonding on the circuit board for mounting the semiconductor device, crack is caused in the semiconductor device due to the stress which is generated when the semiconductor device, wherein moisture in present in the semiconductor device as the cured product of resin composition of the semiconductor device absorbs moisture, is subjected to a high temperature environment during a solder reflow treatment and the moisture quickly evaporates.

In order to solve the problems, an encapsulant using a resin excellent in heat resistance and adhesion (for instance, see Japanese Patent Application Laid-open (JP-A) No. 2000-302, 842, p. 2-6), and a die bonding material having increased adhesion strength (for instance, see JP-A No. 2001-123, 013, p. 2-8) are studied. However, a lead-free solder having higher melting point than a conventional solder is increasingly used from the viewpoint of the environmental concerns. By applying the lead-free solder, mounting temperature needs to be increased by about 20° C. than that of the conventional solder. Hence, there is a problem that reliability of the semiconductor device after mounting decreases significantly than current situation. Therefore, demand for improvement in the resin composition so as to improve reliability of the semiconductor device is increasing. Development of a semiconductor device excellent in reflow crack resistance is desired.

Furthermore, recently, a semiconductor device (package) having elements of different functions or the like mounted on the same device is developed to pursue higher function of the semiconductor device. As such a package, there is a stacked package (hereafter it may be also referred as "area mount type semiconductor device mounting a stacked element"). The stacked package is a package wherein plural semiconductor elements of different functions, for instance, a logic element, a memory element or the like, are stacked via an adhesive or the like and each element is bonded electrically in order to exhibit functions more efficiently. In this case, in order to avoid increase of thickness of the package due to stacking, the thickness of the semiconductor element itself to be used for the stacked element may be designed to be thin, for example below 200 μm, in many cases. Thereby, the semiconductor element (chip) itself becomes fragile. Also, coupled with downsizing of the package, a ratio of chip area of the semiconductor element bonded directly on a substrate with respect to substrate area, wherein the semiconductor element is mounted, increases. Thereby, it causes increase of stress imparted on the semiconductor element bonded directly on the substrate. Further, since the semiconductor element has the above-mentioned stacked structure, there are a lot of interfaces. Due to such reasons, it has been difficult to maintain or improve reliability of the stacked package as a whole.

SUMMARY OF THE INVENTION

An object of the present invention is to provide an area mount type semiconductor device mounting a semiconductor element or a stacked element having high reliability when the semiconductor element or the stacked element is mounted on a surface with the use of a lead-free solder, and a die bonding resin composition and an encapsulating resin composition used for the area mount type semiconductor device.

[1] The present invention provides an area mount type semiconductor device comprising a substrate, and a semiconductor element mounted on a surface of the substrate via a die bonding resin composition, and substantially having only the surface of the substrate mounting the semiconductor element encapsulated with the use of an encapsulating resin composition, wherein an elastic modulus of a cured product of the die bonding resin composition at 260° C. is 1 MPa to 120 MPa, an elastic modulus of a cured product of the encapsulating resin composition at 260° C. is 400 MPa to 1,200 MPa, and a thermal expansion coefficient of the cured product of the encapsulating resin composition at 260° C. is 20 ppm to 50 ppm.

[2] The present invention also provides an area mount type semiconductor device as mentioned above, wherein the area mount type semiconductor device has a stacked element structure, in which one or more semiconductor elements as same as or different from the above-mentioned semiconductor element mounted on the surface of the substrate via the die bonding resin composition are further mounted on the above-mentioned semiconductor element.

[3] Also, the present invention provides a die bonding resin composition used for an area mount type semiconductor device comprising a substrate, and a semiconductor element mounted on a surface of the substrate via the die bonding resin composition, and substantially having only the surface of the substrate mounting the semiconductor element encapsulated with the use of an encapsulating resin composition, wherein an elastic modulus of a cured product of the die bonding resin composition at 260° C. is 1 MPa to 120 MPa.

[4] The present invention also provides a die bonding resin composition as mentioned above, wherein the area mount type semiconductor device has a stacked element structure, in which one or more semiconductor elements as same as or different from the above-mentioned semiconductor element mounted on the surface of the substrate via the die bonding resin composition are further mounted on the above-mentioned semiconductor element.

[5] Further, the present invention provides an encapsulating resin composition used for an area mount type semiconductor device comprising a substrate, and a semiconductor element mounted on a surface of the substrate via a die bonding resin composition, and substantially having only the surface of the substrate mounting the semiconductor element encapsulated with the use of the encapsulating resin composition, wherein an elastic modulus of a cured product of the encapsulating resin composition at 260° C. is 400 MPa to 1,200 MPa, and a thermal expansion coefficient of the cured product of the encapsulating resin composition at 260° C. is 20 ppm to 50 ppm.

[6] The present invention also provides an encapsulating resin composition as mentioned above, wherein the area mount type semiconductor device has a stacked element structure, in which one or more semiconductor elements as same as or different from the above-mentioned semiconductor element mounted on the surface of the substrate via the die bonding resin composition are further mounted on the above-mentioned semiconductor element.

According to the present invention, a die bonding resin composition and an encapsulating resin composition which are excellent in low stress property and solder crack resistance can be obtained even at higher mounting temperature than the conventional temperature. Also, by applying the die bonding resin composition and the encapsulating resin composition of the present invention, an area mount type semiconductor device mounting a semiconductor element or a stacked element having high reliability when a semiconductor element is mounted on a surface with the use of a lead-free solder even at higher mounting temperature than the conventional temperature can be obtained.

BRIEF DESCRIPTION OF THE DRAWINGS

In the accompanying drawings.

Figure 1:
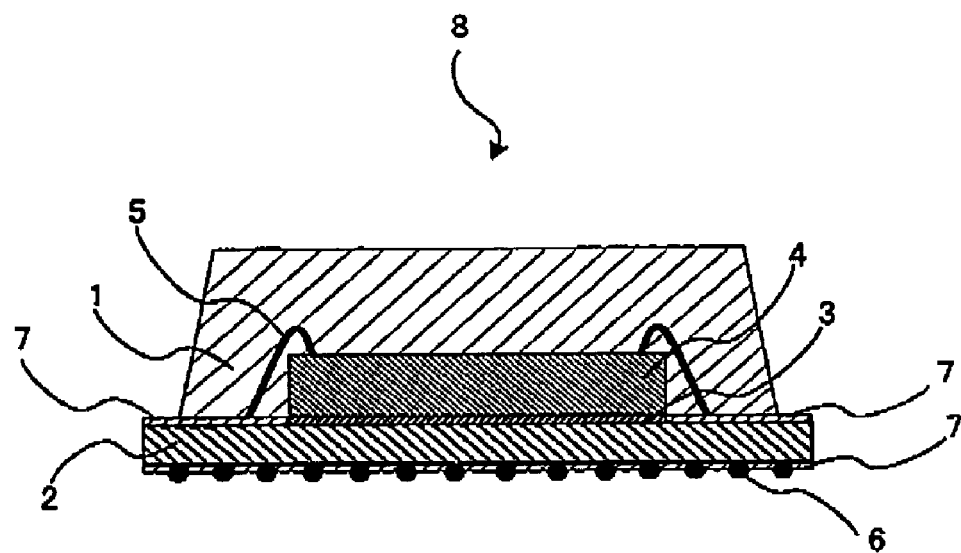
FIG. 1 is a schematic cross-sectional view of an area mount type semiconductor device mounting a semiconductor element.

The numerical symbol in each figure refers to the following: 1: a encapsulating resin (a cured product of an encapsulating resin composition), 2: a substrate, 3: an adhesive layer (a cured product of a die bonding resin composition); 3a: a first adhesive layer (a cured product of a die bonding resin composition); 3b: a second adhesive layer; 4: a semiconductor element; 4a: a first semiconductor element; 4b: a second semiconductor element; 5: a golden wire; 6: a solder ball; 7: a resist layer, 8: a semiconductor device; and 9: a stacked element.

DETAILED DESCRIPTION OF THE INVENTION

An area mount type semiconductor device of the present invention is a semiconductor device comprising a substrate, and a semiconductor element mounted on a surface of the substrate via a die bonding resin composition, and substantially having only the surface of the substrate mounting the semiconductor element encapsulated with the use of an encapsulating resin composition, and by applying materials such as the die bonding resin composition, a cured product of which has an elastic modulus at 260° C. of 1 MPa to 120 MPa, and the encapsulating resin composition, a cured product of which has an elastic modulus at 260° C. of 400 MPa to 1,200 MPa and a thermal expansion coefficient at 260° C. of 20 ppm to 50 ppm, the area mount type semiconductor device of the present invention having high reliability when a semiconductor element is mounted on a surface with the use of a lead-free solder can be obtained.

Also, the area mount type semiconductor device of the present invention may have a stacked element structure, in which one or more semiconductor elements as same as or different from the above-mentioned semiconductor element mounted on the surface of the substrate via the die bonding resin composition are further mounted on the above-mentioned semiconductor element.

Hereinafter, the present invention will be explained in detail.

A die bonding resin composition refers to a resin composition which bonds a semiconductor element and a substrate for producing a semiconductor device. In the present invention, it is essential that a cured product of a die bonding resin composition being used has an elastic modulus of 1 MPa to 120 MPa at 260° C. The form of the die bonding resin composition may not be particularly limited, for example, there may be a resin paste, a resin film and the like.

The resin paste which can be used as the die bonding resin composition of the present invention (hereinafter it may be referred as a die bonding resin paste) mainly comprises a thermosetting resin and a filler, and is characterized in that the cured product of the resin paste has an elastic modulus of 1 MPa to 120 MPa at 260° C. The thermosetting resin used for the resin paste is a general thermosetting resin comprising a resin, a curing agent, a curing accelerator or the like, which may not be particularly limited. However, since the material is to form a paste, it is desirable that the material of the thermosetting resin is in a liquid state at room temperature.

Herein, the elastic modulus is measured in the following manner: after a resin paste is applied on a Teflon (trade name) sheet to have a width of 4 mm, a length of about 50 mm and a thickness of 200 μm followed by curing for a predetermined time, for example 30 minutes, at a predetermined temperature, for example 175° C., in an oven, the resin paste cured product is peeled from the Teflon (trade name) sheet. A sample of the obtained resin paste cured product having a length of 20 mm is measured by means of the dynamic viscoelasticity measurement at a frequency of 10 Hz by increasing temperature from −100° C. to 330° C. at a rate of 5° C./min. to calculate an elastic modulus (hereafter it may be referred as a storage modulus) at 260° C.

As the thermosetting resin used for the resin paste, there may be an epoxy resin in liquid form, a compound having a radical polymerizable functional group such as various acrylic resins, maleimide resins, triaryl isocyanulate having an aryl group or the like, or a cyanate resin in liquid form, which can be solely used or in combination of two or more kinds.

As the epoxy resin in liquid form, there may be, for example, a bisphenol A type epoxy resin, a bisphenol F type epoxy resin, a bisphenol E type epoxy resin, an alicyclic epoxy resin, an aliphatic epoxy resin, a glycidyl amine type epoxy resin in liquid form or the like.

As the compound having a radical polymerizable functional group, there may be alicyclic (meth)acrylic ester, aliphatic (meth)acrylic ester, aromatic (meth)acrylic ester, aliphatic dicarboxylic (meth)acrylic ester, aromatic dicarboxylic (meth)acrylic ester, maleimide, an allyl compound or the like.

As the cyanate resin in liquid form, there may be 3,3′,5,5′-tetramethyl-4,4′-dicyanatediphenylmethane, 2,2-bis(4-cyanatephenyl)propane, 2,2-bis(4-cyanatephenyl)ethane, a novolac type cyanate resin, a bisphenyl A type cyanate resin, a bisphenol E type cyanate resin, a bisphenol F type cyanate resin or the like.

In the present invention, a thermosetting resin in solid form at room temperature may be mixed as the thermosetting resin for the resin paste to the extent that properties of the resin paste do not decline. As an example of the thermosetting resin in solid form at room temperature to be used together, which may be not particularly limited, there may be an epoxy resin such as polyglycidyl ether, a biphenyl type epoxy resin, a stilbene type epoxy resin, a hydroquinone type epoxy resin, a triphenol methane type epoxy resin, a phenol aralkyl type epoxy resin including phenylene and diphenylene structures, an epoxy resin containing a naphthalene structure, a dicyclopentadiene type epoxy resin or the like obtainable from the reaction of bisphenol A, bisphenol F, phenol novolac or cresol novolac and epichlorohydrin. Also, a monoepoxy resin such as n-butyl glycidyl ether, versatic acid glycidyl ester, styrene oxide, ethyl hexyl glycidyl ether, phenyl glycidyl ether, cresyl glycidyl ether, butyl phenyl glycidyl ether or the like may be also used. As an example of a maleimide resin, there may be a bismaleimide resin such as N,N′-(4,4′-diphenylmethane) bismaleimide, bis(3-ethyl-5-methyl-4-maleimidephenyl) methane, 2,2-bis[4-(4-maleimidephenoxy)phenyl]propane or the like.

The containing amount of the thermosetting resin is preferably 20% or less with respect to the amount of the whole resin paste. If the containing amount of the thermosetting resin is out of the above range, the resin paste with increased viscosity poses a problem for coating process such as dispensing or the like.

As a curing agent in the case of using the epoxy resin as the thermosetting resin for the resin paste, there may be, for example, a phenolic resin, aliphatic amine, aromatic amine, dicyandiamide, a dicarboxylic acid dihydrazide compound, carboxylic anhydride or the like. The containing amount of the curing agent is defined by "the total number of epoxy group of an epoxy resin/the total number of active hydrogen of a curing agent or a curing agent after hydrolysis if the curing agent is acid anhydride or the like)" and may be preferably in the range of 0.8 to 1.2. If the containing amount exceeds the above range, heat resistance may decline significantly. If the containing amount lowers the above range, heat resistance and water absorption rate may deteriorate, which are not preferable.

As a curing accelerator and curing agent in the case of using the epoxy resin as the thermosetting resin for the resin paste, there may be, for example, various imidazole compounds such as general imidazole including 2-methylimidazole, 2-ethylimidazole, 2-phenyl-4-methyl-5-hydroxymethyl imidazole, 2-$C_{11}H_{23}$-imidazole or the like, triazine or isocyanuric acid addition type imidazole such as 2,4-diamino-6-{2-methylimidazole-(1)}-ethyl-S-triazine, isocyanate addition type thereof, or the like, which may be used alone or in combination. The containing amount of the curing accelerator and curing agent is preferably 0.01 wt % to 10 wt % with respect to the amount of the whole resin paste. If the containing amount is out of the above range, curability may lower and pot life may be deteriorated.

As a polymerization initiator for the resin paste in the case of using the compound having a radical polymerizable functional group as the thermosetting resin, there may not be particularly limited if it is a catalyst used for general radical polymerization, for example, a heat-radical polymerization initiator such as organic peroxide or the like. The containing amount of the polymerization initiator is preferably 0.001 wt % to 2 wt % with respect to the amount of the whole resin paste. If the containing amount is out of the above range, curability may lower and pot life may be deteriorated.

As a curing catalyst in the case of using the cyanate resin as the thermosetting resin for the resin paste, there may be, for example, a metallic complex such as copper acetyl acetonato, zinc acetyl acetonato or the like. The containing amount of the curing catalyst is preferably 0.1 parts by weight to 1.0 part by weight with respect to 100 parts by weight of the cyanate resin. If the containing amount is out of the above range, curability may lower and pot life may be deteriorated.

As a filler for the resin paste, there may be an inorganic filler and an organic filler. As the inorganic filler, there may be, for example, metal powder such as gold powder, silver powder, copper powder, aluminum powder or the like, fused silica, crystalline silica, silicon nitride, alumina, alumina nitride, talc or the like. As the organic filler, there maybe, for example, a silicone resin, a fluoride resin such as polytetrafluoroethylene or the like, an acrylic resin such as polymethyl methacrylate or the like, a crosslinked product of benzoguanamine or melamine and formaldehyde or the like. Among them, the silver powder is particularly preferable since the silver powder has variety in particle diameter, form or the like and is easily available. The metal powder is mainly used to impart conductivity and thermal conductivity.

It is preferable that the containing amount of ionic impurity such as halogen ion, alkali metal ion or the like in the filler used for the resin paste is 10 ppm or less. The ionic impurity can be measured by ionic chromatography method using a hot water extract of cured product of the resin paste. As a form of the filler, a flake-like filler, a scale-like filler, a branch-like filler or the like can be used. Depending on the required viscosity of the paste, the particle diameter of the filler may vary. Generally, an average particle diameter of the filler is preferably 0.3 μm to 20 μm and the maximum particle diameter of the filler is preferably about 50 μm or less. If the average particle diameter is within the above range, rise of viscosity, generation of bleeding due to outflow of the resin component during coating or curing can be prevented. If the maximum particle diameter is within the above range, a situation that the resin paste blocks an outlet of a needle upon coating the resin paste, which causes that continuous use of the needle to be not possible, can be prevented. Also, relatively rough fillers and fine fillers can be used by mixture. Fillers of various kinds and forms can be accordingly mixed. Herein, the particle diameter can be measured by means of a laser particle size analyzer or the like.

In order to impart required properties, there may be added as the filler for the resin paste, for example, a nano-scale filler having a particle diameter of about 1 nm to 100 nm, a composite material of silica and acrylic acid, an organic and inorganic composite filler such as an organic filler, the surface of which is coated with metal, or the like.

The surface of the filler for the resin paste may be preliminarily subject to treatment with a silane coupling agent such as alkoxy silane, allyloxy silane, silazane, organ amino silane or the like.

Incidentally, the viscosity of the die bonding paste which can be used in the present invention may be preferably 10 Pa·s to 50 Pa·s, more preferably 15 Pa·s to 35 Pa·s. The viscosity is measured by means of an E type viscometer (3° cone) at 2.5 rpm at 25° C. just after producing the resin paste. If the viscosity of the die bonding paste is out of the above range, the resin paste becomes thready or may trickle at the time of coating, which is not preferable.

In the die bonding resin paste which can be used in the present invention, additives such as a silane coupling agent, a titanate coupling agent, a low stress agent, a pigment, a dye, a defoaming agent, a surfactant, a solvent or the like may be used, if required, as long as the properties required for the use are not deteriorated.

The die bonding resin paste which can be used in the present invention may be produced by, for example, preliminarily mixing each component, mixing and kneading with the use of a three-roll, wet-type bead mill or the like followed by defoaming under vacuum, or the like, In order to make the elastic modulus at 260° C. of a cured product of the die bonding resin paste which can be used in the present invention be 1 MPa to 120 MPa, it is desirable to introduce many structures not containing an aromatic ring such as an aliphatic chain (hydrocarbon chain), an alicyclic structure or the like in the resin structure by using a liquid epoxy resin such as a hydrogenated bisphenol A type epoxy resin, 1,4-cyclohexane dimethanol diglycidyl ether, 1,4-butadiol diglycidyl ether, 1,6-hexanediol diglycidyl ether or the like; a solid epoxy resin such as a dicyclopentadiene type epoxy resin or the like; a compound such as polybutadiene, polyisoprene, polyalkylene oxide, aliphatic polyester, polynorbornene or the like having a radical polymerizable functional group including an acryloyl group, a methacryloyl group, an acrylamide group, a maleimide group, a vinyl ester group, a vinyl ether group or the like in the molecule as a thermosetting resin. Also, it is effective to use a low stress agent such as a butadiene-acrylonitrile copolymer having a carboxyl group in the end, phthalic acid ester or the like.

A method of bonding a semiconductor element to a substrate for mounting the semiconductor element such as a printed wiring board, a metal lead frame, a substrate of a glass fiber having the epoxy resin impregnated, a polyimide substrate, a bismaleimide-triazine resin substrate or the like using the die bonding resin paste which can be used in the present invention may be conducted in conventional manners. For example, after applying the resin paste on the substrate by point coating with the use of multi needle or single needle, line-drawing with the use of single needle, screen printing, stamping or the like, a semiconductor element is mounted thereon followed by heating to cure the resin paste by means of an oven, a hot plate, an in-line cure machine or the like. The die bonding resin paste of the present invention may be similarly applied to bonding between semiconductors comprising a stacked element.

The resin film which can be used as the die bonding resin composition of the present invention (hereinafter it may be referred as a die bonding resin film) mainly comprises a thermoplastic resin and a curable resin, and is characterized in that the cured product of the resin film has an elastic modulus of 1 MPa to 120 MPa at 260° C.

Herein, the elastic modulus is measured in the following manner: after a resin film is cured for a predetermined time, for instance 60 minutes, at a predetermined temperature, for instance 180° C., in an oven, a sample of the cured resin film having a length of 20 mm is measured by means of the dynamic viscoelasticity measurement at a frequency of 10 Hz by increasing temperature from −100° C. to 330° C. at a rate of 5° C./min. to calculate an elastic modulus (storage modulus) at 260° C.

The thickness of the resin film after curing is preferably 5 μm to 50 μm. If the thickness of the resin film lowers the above range, a void is likely to remain upon adhesion. If the thickness of the resin film exceeds the above range, the thickness of the whole package increases, which is not preferable.

As the thermoplastic resin used for the resin film, there may be a polyimide based resin such as a polyimide resin, a polyether imide resin or the like, a polyamide based resin such as a polyamide resin, a polyamideimide resin or the like, an acrylic resin or the like. Among them, the acrylic resin is preferable since an initial adhesion of the resin film can be improved. Herein, the initial adhesion means adhesion in an initial stage when a semiconductor element and a substrate are bonded with the use of the die bonding resin film, that is, adhesion before the die bonding resin film is subject to a curing treatment.

The acrylic resin means acrylic acid and a derivative thereof. Specifically, there may be a polymer of acrylic acid ester such as acrylic acid, methacrylic acid, methyl acrylate, ethyl acrylate or the like, methacrylic acid ester such as methyl methacrylate, ethyl methacrylate or the like, acrylonitrile, acrylamide or the like, and a copolymer of the above mentioned monomer and other monomers.

Also, as the above-mentioned acrylic resin, an acrylic resin (particularly, an acrylic acid ester copolymer) containing a compound having a functional group such as an epoxy group, a hydroxyl group, a carboxyl group, a nitrile group or the like is preferable. By using such an acrylic resin containing a compound having a functional group, adhesion to an adherend such as a semiconductor element can be even more improved. As the acrylic resin containing a compound having a functional group, there may be, specifically, glycidyl methacrylate having a glycidyl ether group, hydroxy methacrylate having a hydroxyl group, carboxyl methacrylate having a carboxyl group, acrylonitrile having a nitrile group or the like.

Among them, an acrylic acid copolymer containing a compound having a nitrile group is particularly preferable.

A containing amount of the acrylic resin containing a compound having a functional group may not be particularly limited, but 0.5 wt % to 40 wt % of the whole amount of the acrylic resin is preferable, more preferably 5 wt % to 30 wt %. If the containing amount is within the above range, the die bonding resin film having an appropriate adhesion can be obtained and workability upon producing the die bonding resin film becomes excellent.

A weight average molecular weight of the thermoplastic resin (particularly, the acrylic resin) used for the resin film may not be particularly limited, but 100,000 or more is preferable, particularly 150,000 to 1,000,000 is preferable. If the weight average molecular weight is within the above range, particularly, film-forming property of the die bonding resin film can be improved.

As the curable resin used for the resin film, there may be a thermosetting resin, an ultraviolet curing resin, an electron beam-curable resin or the like. The curable resin may include a curable resin which functions as a curing agent to be hereinafter described.

The thermosetting resin may be preferably contained in the curable resin since heat resistance (particularly, solder reflow resistance at 260° C.) of the resin film may be particularly improved.

As the thermosetting resin, for example, there may be a novolac type phenolic resin such as a phenol novolac resin, a cresol novolac resin, a bisphenol A novolac resin or the like; a phenolic resin such as a resole phenolic resin or the like; a bisphenol type epoxy resin such as a bisphenol A epoxy resin, bisphenol F epoxy resin or the like; a novolac type epoxy resin such as a novolac epoxy resin, a cresol novolac epoxy resin or the like; an epoxy resin such as a bisphenyl type epoxy resin, a stilbene type epoxy resin, a triphenol methane type epoxy resin, an alkyl-modified triphenol methane type epoxy resin, a triazine ring-containing epoxy resin, a dicyclopentadiene-modified phenol type epoxy resin or the like; a resin containing triazine ring such as an urea resin, a melamine resin or the like; an unsaturated polyester resin; a bismaleimide resin; a polyurethane resin; a diallyl phthalate resin; a silicone resin; a resin containing a benzo oxazine ring; a cyanate ester resin or the like, which may be used alone or in combination thereof. Among them, the epoxy resin is particularly preferable since heat resistance and adhesion of the resin film can be improved.

The epoxy resin may not be particularly limited, but a crystalline epoxy resin may be preferable. As such a crystalline resin, there may be a crystalline epoxy resin which has a rigid structure such as a biphenyl structure, a bisphenol structure, a stilbene structure or the like as a principal chain and a relatively low molecular weight. The crystalline epoxy resin is preferable since the crystalline epoxy resin is a crystalline solid substance in normal temperature which rapidly dissolves at a temperature higher than the melting point and changes into a liquid having low viscosity, therefore, the initial adhesion of the resin film can be improved.

The melting point of the crystalline epoxy resin may not be particularly limited, but a melting point from 50° C. to 150° C. is preferable, more preferably from 60° C. to 140° C. If the melting point of the crystalline epoxy resin is within the above range, particularly, low-temperature adhesion of the resin film can be improved.

The melting point can be evaluated with, for example, the peak temperature of an endothermic peak when melting a crystal by increasing temperature at a rate of 5° C. from normal temperature by means of the differential scanning calorimeter.

A containing amount of the thermosetting resin may not be particularly limited, but 10 parts by weight to 100 parts by weight with respect to 100 parts by weight of the thermoplastic resin, more preferably 30 parts by weight to 70 parts by weight. If the containing amount of the thermosetting resin is within the above range, both heat resistance and toughness of the resin film can be improved.

It is preferable that the curable resin used for the resin film further contains the ultraviolet curing resin since the initial adhesion of the resin film can be even more improved.

As the ultraviolet curing resin, there maybe, for example, an ultraviolet curing resin having an acrylic compound as a main component, an ultraviolet curing resin having an urethane acrylate oligomer or a polyester urethane acrylate oligomer as a main component, an ultraviolet curing resin having one kind selected from the group consisting of an epoxy based resin and a vinyl phenolic resin as a main component or the like.

Among them, the ultraviolet curing resin having an acrylic compound as a main component may be preferable since the initial adhesion of the resin film can be even more improved. As the acrylic compound, there may be a monomer such as acrylic acid ester, methacrylic acid ester or the like. Specifically, there may be difunctional acrylate such as ethylene glycol diacrylate, ethylene glycol dimethacrylate, 1,6-hexanediol diacrylate, 1,6-hexanediol dimethacrylate, glycerol diacrylate, glycerol dimethacrylate, 1,10-decanediol diacrylate, 1,10-decanediol dimethacrylate or the like; polyfunctional acrylate such as trimethylolpropane triacrylate, trimethylolpropane trimethacrylate, pentaerythritol triacrylate, pentaerythritol trimethacrylate, dipentaerythritol hexaacrylate, dipentaerythritol hexamethacrylate or the like. Among them, acrylic acid ester is preferable. Particularly, acrylic acid ester or alkyl methacrylate ester having 1 to 15 carbons in the ester moiety may be preferable.

A containing amount of the ultraviolet curing resin may not be particularly limited, but 20 parts by weight to 55 parts by weight with respect to 100 parts by weight of the thermoplastic resin, more preferably 30 parts by weight to 40 parts by weight. If the containing amount of the ultraviolet curing resin is within the above range, decline in adhesion of the resin film and decrease in peeling ability due to high adhesion of the resin film with the substrate can be prevented.

When acrylic acid ester or methacrylic acid ester of the ultraviolet curing resin having a hydroxyl group in the molecule is further used together with the ultraviolet curing resin, adhesion of the resin film and an adherend and property of an adhesive can be easily controlled.

The ultraviolet curing resin may not be particularly limited, but may be preferable to be in liquid state at normal temperature since the minimum melt viscosity can be particularly lowered and the low-temperature adhesion can be improved. As the ultraviolet curing resin in liquid state at normal temperature, there may be the above-mentioned ultraviolet curing resin having the acrylic compound as a main component or the like.

It is further preferable to use a photopolymerization initiator together with the ultraviolet curing resin since in the case that the die bonding resin film is difficult to peel from the substrate, by irradiating ultraviolet ray, the surface of the die bonding resin film is cured and peeling of the die bonding resin film becomes easy.

As the photopolymerization initiator, there may be, for example, benzophenone, acetophenone, benzoin, benzoin isobutyl ether, methyl benzoin benzoate, benzoin benzoic acid, benzoin methyl ether, benzyl phenyl sulfide, benzyl, dibenzyl, diacetyl or the like.

A containing amount of the photopolymerization initiator may not be particularly limited, but 1 part by weight to 30 parts by weight with respect to 100 parts by weight of the ultraviolet curing resin, more preferably 3 parts by weight to 15 parts by weight. If the containing amount of the photopolymerization initiator is within the above range, initiation of photopolymerization can be ascertained, and deterioration of storage stability due to excessive reactivity can be prevented.

As other components, there may not be particularly limited, however, the resin film may preferably contain an organic compound having a cyanate group since both adhesion to an adherend and heat resistance of the resin film can be improved.

As the organic compound having a cyanate group, there may be bisphenol A dicyanate, bisphenol F dicyanate, bis(4-cyanate phenyl)ether, bisphenol E dicyanate, a cyanate novolac resin or the like.

A containing amount of the organic compound having a cyanate group may not be particularly limited, but 1 parts by weight to 50 parts by weight with respect to 100 parts by weight of the thermoplastic resin, more preferably 3 parts by weight to 30 parts by weight. If the containing amount of the organic compound having a cyanate group is within the above range, an effect can be obtained to improve adhesion and heat resistance of the resin film.

In the case that the curable resin is the epoxy resin, a curing agent, particularly a phenolic curing agent, may be preferably contained in the resin film.

As the curing agent, for example, an amine based curing agent such as an aliphatic polyamine including diethylene triamine (DETA), triethylene tetraamine (TETA), methaxylene diamine (MXDA) or the like, an aromatic polyamine including diaminodiphenylmethane (DDM), m-phenylene diamine (MPDA), diaminodiphenyl sulfone (DOS) or the like, a polyamine compound containing dicyane diamide (DICY), organic acid dihydrazide or the like; an acid anhydride based curing agent such as an alicyclic acid anhydride (acid anhydride in liquid state) including hexahydrophthalic anhydride (HHPA), methyltetrahydrophthalic anhydride (MTHPA) or the like, an aromatic acid anhydride including trimellitic anhydride (TMA), pyromellitic dianhydride (PMDA), benzophenone tetracarboxylic dianhydride (STDA) or the like; a phenolic curing agent including a phenolic resin or the like.

Among them, the phenolic curing agent is preferable. Specifically, there may be a compound selected from the group consisting of various isomers of bisphenols such as bis(4-hydroxy-3,5-dimethylphenyl)methane (commonly known as tetramethyl bisphenol F), 4,4'-sufonyldiphenol, 4,4'-isopropylidene diphenol (commonly known as bisphenol A), bis(4-hydroxyphenyl)methane, bis(2-hydroxyphenyl)methane, (2-hydroxyphenyl)(4-hydroxyphenyl)methane, a mixture of bis(4-hydroxyphenyl)methane, bis(2-hydroxyphenyl)methane, and (2-hydroxyphenyl)(4-hydroxyphenyl)methane, for instance, bisphenol F-D (product name, manufactured by Honshu Chemical Industry Co., Ltd.), and the like; dihydroxybenzenes such as 1,2-benzenediol, 1,3-benzenediol, 1,4-benzenediol and the like; trihydroxybenzenes such as 1,2,4-benzenetriol and the like; dihydroxynaphthalenes such as 1,6-dihydroxynaphthalene and the like, and various isomers of biphenols such as 2,2'-biphenol, 4,4'-biphenol and the like.

A containing amount of the curing agent, particularly the phenolic curing agent, of the epoxy resin may not be particularly limited, but 1 parts by weight to 30 parts by weight with respect to 100 parts by weight of the epoxy resin, more preferably 3 parts by weight to 10 parts by weight. If the containing amount of the curing agent of the epoxy resin is within the above range, heat resistance of the resin film can be improved and decline of storage stability of the resin film can be prevented.

Further, a filler may be preferably contained in the resin film, though there may not be particularly limited, since heat resistance of the resin film can be even more improved.

As the filler, there may be, for example, an inorganic filler such as silver, titan oxide, silica, mica or the like; an organic filler such as a particle of silicone gum, polyimide or the like. Among them, the inorganic filler, particularly a silica filler, is preferable since heat resistance of the resin film can be even more improved.

A containing amount of the filler, particularly the inorganic filler, may not be particularly limited, but 1 parts by weight to 100 parts by weight with respect to 100 parts by weight of the thermoplastic resin, more preferably 10 parts by weight to 50 parts by weight. If the containing amount of the filler is within the above range, heat resistance and adhesion of the resin film can be improved.

An average particle diameter of the filler, particularly the inorganic filler, may not be particularly limited, but may be preferably 0.1 µm to 25 µm, more preferably 0.5 µm to 20 µm. If the average particle diameter is within the above range, heat resistance of the resin film can be improved and decline of adhesion of the resin film can be prevented. Herein, the average particle diameter may be measured by means of a laser particle size analyzer.

The die bonding resin film which can be used in the present invention can be obtained, for instance, in such a manner that a resin composition comprising the thermoplastic resin and the curable resin as main components, and appropriately compounding the above-mentioned components, if necessary, is dissolved in a solvent such as methyl ethyl ketone, acetone, toluene, dimethyl formaldehyde or the like to form a resin varnish, thereafter, the resin varnish is applied on a substrate by means of the comma coater, the die coater, the gravure coater or the like followed by drying and removing the substrate. As the substrate, there may not be particularly limited but there may be polyimide, polyethylene terephthalate, Teflon (trademark) or the like.

The thickness of the die bonding resin film may not be particularly limited, but may be preferably 3 µm to 100 µm, more preferably 5 µm to 75 µm. If the thickness of the die bonding resin film is within the above range, thickness accuracy of the die bonding resin film can be easily controlled.

In order to make the elastic modulus at 260° C. of a cured product of the die bonding resin film which can be used in the present invention be 1 MPa to 120 MPa, it is desirable to use both thermoplastic resin, particularly the acrylic resin, which is excellent in low elasticity when heated and adhesion, and the thermosetting resin, particularly the epoxy resin, which is excellent in heat resistance and adhesion. By accordingly adjusting the compounding ratio of the thermoplastic resin and the thermosetting resin according to the kinds of the thermoplastic resin and the thermosetting resin to be used, the cured product of the die bonding resin film having low elasticity when heated can be obtained so as to reduce stress generated in the die bonding resin film without declining heat resistance and adhesion of the die bonding resin film.

Next, a method of bonding a semiconductor element with the use of the die bonding resin film will be explained.

The obtained resin film can be used for bonding a semiconductor element with a substrate for mounting the semiconductor element such as a printed wiring board, a metal lead frame, an organic substrate including a substrate of a glass fiber having the epoxy resin impregnated, a polyimide substrate, a bismaleimide-triazine resin substrate or the like.

As a condition of the above-mentioned bonding of the semiconductor element, the semiconductor element and the substrate for mounting the semiconductor element may be compressed via the resin film at 80° C. to 200° C. for 0.1 second to 30 seconds. Thereafter, if necessary, the semiconductor element is subject to wire-bonding and encapsulating with an encapsulant, thus, a semiconductor device can be obtained. The die bonding resin film of the present invention may be similarly applied to bonding between semiconductors comprising a stacked element.

The encapsulating resin composition (hereinafter, it may be referred as an encapsulating material) is a resin composition for encapsulating an electronic part such as the semiconductor element mounted on the substrate to form a semiconductor device. The encapsulating resin composition used in the present invention comprises an epoxy resin, a phenolic resin curing agent, a curing accelerator and an inorganic filler as a main component, wherein an elastic modulus of a cured product of the encapsulating resin composition at 260° C. is 400 MPa to 1,200 MPa, and a thermal expansion coefficient of the cured product of the encapsulating resin composition at 260° C. is 20 ppm to 50 ppm.

Herein, the elastic modulus is measured in the following manner: with reference to JIS K 6911, a test sample of an encapsulating resin composition having a size of 80 mm×10 mm×4 mm (thickness) is molded under the condition of a mold temperature of 175° C., an injection pressure of 6.9 MPa and a curing time of 90 seconds by means of a transfer molding machine. Then, after the test sample is subject to post-curing at 175° C. for 2 hours, an elastic modulus (hereafter it may be referred as a flexural modulus) is measured at 260° C.

Also, the thermal expansion coefficient is measured in the following manner: a sample of an encapsulating resin composition having a size of 10 mm×4 mm×4 mm (thickness) is molded under the condition of a mold temperature of 175° C., an injection pressure of 6.9 MPa and a curing time of 90 seconds by means of a transfer molding machine. Then, after the cured product is subject to post-curing at 175° C. for 2 hours, TMA (thermo mechanical analysis) is performed by increasing temperature at a rate of 5° C./min to obtain a thermal expansion coefficient at 260° C. from a TMA curve.

The epoxy resin used for the encapsulating resin composition of the present invention refers to a monomer, oligomer, and polymer having an epoxy group in general. For example, there may be a bisphenol type epoxy resin, a biphenyl type epoxy resin, a stilbene type epoxy resin, a hydroquinone type epoxy resin, an o-cresol novolac type epoxy resin, a triphenol methane type epoxy resin, a phenol aralkyl type epoxy resin including one containing a phenylene or diphenylene structure, an epoxy resin containing a naphthalene structure, a dicyclopentadiene type epoxy resin and the like, one kind of which may be solely used, or two or more kinds of which may be used together.

In order to aim at low elasticity when heated, a resin having a flexible structure such as the dicyclopentadiene type epoxy resin is preferable. However, since such a resin having low elasticity when heated has, at the same time, a high thermal expansion characteristic when heated so as to decline crack resistance, it becomes necessary to lower thermal expansion by increasing the amount of the filler, which means that lowering of viscosity of the epoxy resin is also important.

Therefore, in order to obtain both low elasticity when heated and low thermal expansion when heated, it is preferable to use the epoxy resin excellent in balance between flexibility and fluidity when heated such as the biphenyl type epoxy resin, the bisphenol type epoxy resin, the phenol aralkyl type epoxy resin and the like. Also, not solely but several kinds of epoxy resins may be mixed to take balance between flexibility and fluidity.

The phenolic resin used for the encapsulating resin composition of the present invention as a curing agent refers to a monomer, oligomer, polymer having two or more phenolic groups in one molecule in general which may be capable of promoting a curing reaction with the epoxy resin so as to form a crosslinking structure. For example, there may be a phenol novolac resin, a cresol novolac resin, a phenol aralkyl resin including one having a phenylene or biphenylene structure, a naphthol aralkyl resin, a triphenol methane resin, a dicyclopentadiene type phenolic resin and the like, one kind of which may be solely used, or two or more kinds of which may be used together.

Similarly as the epoxy resin, in order to obtain low elasticity when heated and low thermal expansion when heated, the phenolic resin excellent in balance between flexibility and fluidity when heated such as the phenol aralkyl resin, the naphthol aralkyl resin and the like may be preferably used. Also, not solely but several kinds of phenolic resins may be mixed to take balance between flexibility and fluidity.

Equivalence ratio (a/b) of the number (a) of epoxy group in the total amount of the epoxy resin with respect to the number (b) of phenolic hydroxyl group in the total amount of the phenolic resin is preferably in the range of 0.5 to 2, more preferable 0.7 to 1.5. If the equivalence ratio is in the above-mentioned range, decline of moisture resistance, curability or the like can be prevented. The containing amount of the epoxy resin and the phenolic resin is preferably 5 wt % to 20 wt % with respect to the amount of the whole encapsulating resin composition. If the containing amount is within the above range, crack resistance due to increase of thermal expansion coefficient decreases, and decline of flowability can be prevented.

The curing accelerator used for the encapsulating resin composition of the present invention may be one capable to be a catalyst of the crosslinking reaction between the epoxy resin and the phenolic resin. For example, there may be an amine compound such as 1,8-diazabicyclo(5,4,0)undecene-7, tributyl amine or the like; an organic phosphine based compound such as triphenyl phosphine, tetraphenyl phosphonium•tetraphenyl borate salt or the like; an imidazole compound such as 2-methyl imidazole or the like, which may be limited thereto and may be used solely or in combination. The containing amount of the curing accelerator is preferably 0.05 wt % to 2 wt % with respect to the amount of the whole encapsulating resin composition. If the containing amount is out of the above range, curability may be lowered or flowability, pot life or the like may decrease.

The inorganic filler used for the encapsulating resin composition of the present invention may not be limited to specific kinds, and one generally used for an encapsulating material can be used. For example, there may be inorganic filler such as fused silica, crystalline silica, secondary aggregated silica, alumina, titanium white, aluminum hydroxide, talc, clay, glass fiber or the like, one kind of which may be solely used, or two or more kinds of which may be used together. The fused silica is particularly preferable. Either crushed or spherical fused silica can be used. In order to increase the compounding amount of the fused silica and inhibit increase of the melt viscosity of the encapsulating resin composition, it is preferable mainly to use the spherical silica. Further, in order to increase the compounding amount of the spherical silica, it is preferable that the particle size distribution of the spherical silica may be as wide as possible. The total compounding amount of the filler in the whole encapsulating resin composition may be preferably 80 wt % to 95 wt % from the viewpoint of balance between moldability and reliability. It the compounding amount of the inorganic filler is in the above-mentioned range, decline of crack resistance due to increase of thermal expansion coefficient when heated and decrease of fluidity can be prevented. With the increase of the amount of the inorganic filler, elastic modulus when heated tends to increase and the thermal expansion coefficient tends to decrease. Hence, in order to obtain low elasticity when heated and low thermal expansion when heated so as to improve the crack resistance, it is important to take balance of composition with the amount of the filler and the combination of the epoxy resin and the phenol resin curing agent.

Besides the epoxy resin, the phenolic resin curing agent, the curing accelerator and the inorganic filler, the encapsulating resin composition of the present invention may contain, as required, various additives such as a flame retardant including a brominated epoxy resin, antimony oxide, a phosphorus compound or the like; an inorganic ion exchanger including bismuth oxide hydrate or the like; a coupling agent including γ-glycidoxypropyl trimethoxy silane or the like; a colorant including carbon black, red iron oxide or the like; a low stress component including a silicone oil, a silicone rubber or the like; a release agent including a natural wax, a synthetic wax, higher fatty acid, metallic salts thereof, paraffin or the like; an antioxidant or the like.

Further, the inorganic filler may be preliminarily processed with the coupling agent, or the epoxy resin or the phenolic resin curing agent, if required. As the processing method, there may be a method of mixing the inorganic filler and the above-mentioned coupling agent or the like with the use of a solvent and then removing the solvent, a method of directly adding the above-mentioned coupling agent or the like to the inorganic filler to process by means of a mixer or the like. Among the additives, by adding the low stress component such as silicone oil, a silicone rubber or the like, the elastic modulus when heated tends to decrease and the thermal expansion coefficient when heated tends to increase. It is possible to improve crack resistance by appropriately adjusting the compounding amount of the low stress component. Upon adding the low stress component, it is important to take balance of the combination among the filler, the epoxy resin and the phenolic resin curing agent.

In order to make the elastic modulus at 260° C. of a cured product of the encapsulating resin composition which can be used in the present invention be 400 MPa to 1200 MPa, and the thermal expansion coefficient of the cured product of the encapsulating resin composition at 260° C. be 20 ppm to 50 ppm, it is desirable to use the epoxy resin which is excellent in balance of flexibility and flowability when heated such as the biphenyl type epoxy resin, the bisphenol type epoxy resin, the phenolaralkyl type epoxy resin or the like, and/or the phenolic resin which is excellent in balance of flexibility and flowability when heated such as the phenolaralkyl resin, the naphtholaralkyl resin or the like, and further to use the spherical silica having wider particle size distribution than that of the epoxy resin and the phenolic resin. Thereby, the filler can be highly filled in the encapsulating resin composition so that the total compounding amount of the filler in the whole encapsulating resin composition becomes about 80 wt % to 95 wt %. Also, as long as the thermal expansion coefficient at 260° C. does not exceed the upper limit defined in the present invention, a low stress component such as a silicone oil, a silicone gum or the like may be added, thereby, the elastic modulus at 260° C. of a cured product of the encapsulating resin composition can be reduced.

The encapsulating resin composition which can be used as an encapsulating material for a semiconductor element or the like according to the present invention can be obtained by: mixing the epoxy resin, the phenolic resin, the curing accelerator, the inorganic filler, other additives or the like by means of a mixer at normal temperature; thereafter melting and kneading by means of a kneading machine such as a roll, a kneader, an extrusion machine and the like; cooling; and then crushing.

When producing a semiconductor device by encapsulating an electronic part such as a semiconductor element or the like with the use of the encapsulating resin composition of the present invention, curing and molding may be performed in a conventional molding method such as transfer molding, compression molding, injection molding or the like. Particularly, the encapsulating resin composition of the present invention is suitable for an area mount type semiconductor device mounting a semiconductor element or a stacked element since the encapsulating resin composition of the present invention is excellent in low stress property and solder crack resistance.

Next, the area mount type semiconductor device of the present invention will be explained. The area mount type semiconductor device of the present invention comprises a substrate, and a semiconductor element mounted on a surface of the substrate via a die bonding resin composition, and substantially having only the surface of the substrate mounting the semiconductor element encapsulated with the use of an encapsulating resin composition, wherein both die bonding resin composition and encapsulating resin composition mentioned above are used. One embodiment of the area mount type semiconductor device mounting a semiconductor element of the present invention is shown in FIG. 1. In FIG. 1, a resist layer 7 and a solder ball 6 are formed in the semiconductor device 8, but may not be particularly limited to such an embodiment.

Figure 2:
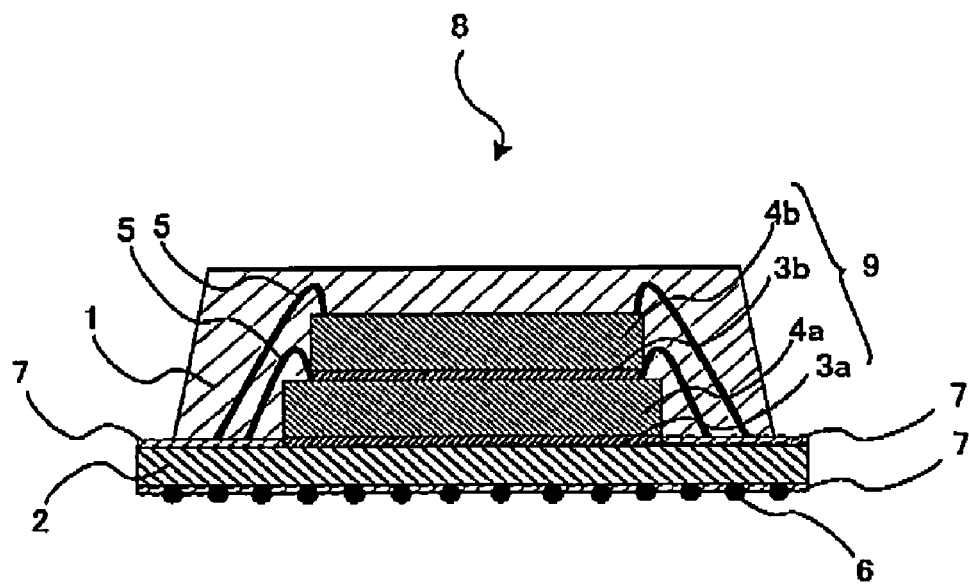
FIG. 2 is a schematic cross-sectional view of an area mount type semiconductor device mounting a stacked element comprising two semiconductor elements.

Also, an area mount type semiconductor device of the present invention may be an area mount type semiconductor device mounting a stacked element, wherein the area mount type semiconductor device as mentioned above has a stacked element structure, in which one or more semiconductor elements as same as or different from the above-mentioned semiconductor element are further mounted on the above mentioned semiconductor element. One embodiment of the area mount type semiconductor device mounting a stacked element of the present invention is shown in FIG. 2. In FIG. 2, a resist layer 7 and a solder ball 6 are formed in the semiconductor device 8, but may not be particularly limited to such an embodiment.

The semiconductor element used for the area mount type semiconductor device of the present invention may not be particularly limited, and may be any semiconductor element, for instance a logic element, a memory element or the like, used for a general semiconductor device, Also, a semiconductor element of the stacked element different from the above-mentioned semiconductor element means a semiconductor element different in function, structure or the like.

The method of producing the area mount type semiconductor device mounting a semiconductor element or a stacked element may not be particularly limited, but the following method can be exemplified. The method of producing an area mount type semiconductor device mounting a semiconductor element is explained in refer to FIG. 1, and the method of producing an area mount type semiconductor device mounting a stacked element is explained in refer to FIG. 2.

<Method of Producing an Area Mount Type semiconductor Device Mounting a Semiconductor Element>

(Method of Mounting Semiconductor Element by Resin Paste)

A semiconductor element 4 (size: 9 mm×9 mm, thickness: 0.20 mm) is mounted on a bismaleimide triazine resin/glass cloth substrate (thickness: 0.36 mm, bismaleimide triazine resin of 155pFPBGA (product name, manufactured by MITSUBISHI GAS CHEMICAL COMPANY, INC); solder resist of PSR4000AUS (product name, manufactured by TAIYO INK MFG, CO., LTD.)) as a substrate 2 via the die bonding resin paste to be an adhesive layer 3 followed by curing in an oven, thus obtained the substrate mounting the semiconductor element. The curing condition of the die bonding resin paste is increasing temperature from room temperature to 175° C. in 30 minutes and maintaining 175° C. for 30 minutes.

(Method of Mounting Semiconductor Element by Resin Film)

The reverse side (the side without IC) of a semiconductor wafer, wherein semiconductor elements are formed, having a thickness of 0.20 mm is attached on one side of the resin film to obtain the semiconductor wafer having the resin film bonded. Thereafter, a dicing film is attached on the resin film. The semiconductor wafer having the resin film and the dicing film bonded is diced so that the size of a semiconductor element is 9 mm×9 mm by means of a dicing saw with a spindle rotation of 30,000 rpm and a dicing speed of 50 mm/sec. Then, the semiconductor element is picked up by pushing the center of the semiconductor element from the backside of the dicing film where no resin film is attached to peel the dicing film from the resin film, thus obtained a semiconductor element having only the resin film bonded.

The semiconductor element 4 having the resin film to be an adhesive layer 3 bonded is compressed to be die bonded on a bismaleimide triazine resin/glass cloth substrate (thickness: 0.36 mm; bismaleimide triazine resin of 155pFPBGA (product name, manufactured by MITSUBISHI GAS CHEMICAL COMPANY, INC); solder resist of PSR4000AUS (product name, manufactured by TAIYO INK MFG, CO., LTD.)) as a substrate 2 at 130° C. and 1 MPa for 1.0 second followed by curing in an oven, thus obtained the substrate mounting the semiconductor element. The curing condition of the resin film is increasing temperature from room temperature to 180° C. in 30 minutes and maintaining 180° C. for 60 minutes.

(Method of Molding Package by Encapsulating Resin Composition)

After wire bonding with the use of a golden wire 5 or the like according to the needs, the substrate mounting the semiconductor element, wherein the semiconductor element 4 is mounted on the substrate 2 with the use of the resin paste or the resin film, is encapsulated and molded to have a size of 16 mm×16 mm and a thickness of 0.7 mm by an encapsulating resin composition to be an encapsulating resin 1 under the condition of a mold temperature of 175° C., an injection pressure of 6.9 MPa and a curing time of 90 seconds by means of a transfer molding machine. Then, the substrate mounting the semiconductor element is subject to post-curing at 175° C. for 2 hours, thus obtained an area mount type semiconductor device 8 (package) mounting the semiconductor element 4.

The area mount type semiconductor device mounting the semiconductor element using the die bonding resin composition and the encapsulating resin composition obtained by the present invention is excellent in low stress property and solder crack resistance although the temperature when the area mount type semiconductor device mounted on a circuit board or the like is subject to solder bonding is 260° C., which is higher than conventional one.

<Method of Producing an Area Mount Type Semiconductor Device Mounting a Stacked Element>

(Method of Mounting Semiconductor Element by Resin Paste or Resin Film)

To produce an area mount type semiconductor device 8 mounting a stacked element of the present invention, firstly, a first semiconductor element 4a is mounted on a substrate 2. Specifically, except that the size of the semiconductor element is changed to 10 mm×10 mm with thickness of 100 μm, a first semiconductor element 4a is mounted on a substrate 2 similarly as the above-mentioned "Method of mounting semiconductor element by resin paste" or "Method of mounting semiconductor element by resin film" of "Method of producing an area mount type semiconductor device mounting a semiconductor element". The die bonding resin composition used herein becomes a first adhesive layer 3a after curing.

Separately, a second semiconductor element 4b having a resin film attached for forming a stacked element is produced similarly as the above-mentioned "Method of mounting semiconductor element by resin film" except that the size of the semiconductor element is changed to 8 mm×8 mm with thickness of 100 μm. Herein, the second semiconductor element 4b may be the same as or different from the first semiconductor element 4a.

Next, the second semiconductor element 4b is compressed on the first semiconductor element 4a in the same press condition as that in the above-mentioned "Method of mounting semiconductor element by resin film", thus obtained a substrate mounting a stacked element 9. The die bonding resin composition used herein becomes a second adhesive layer 3b after curing.

(Method of Molding Package by Encapsulating Resin Composition)

The substrate 2 mounting the stacked element 9 is encapsulated and molded to have a size of 16 mm×16 mm and a thickness of 0.7 mm followed by post-curing similarly as the above-mentioned "Method of molding package by encapsulating resin composition" of "Method of producing an area mount type semiconductor device mounting a semiconductor element". Thus obtained an area mount type semiconductor device 8 mounting a stacked element 9 of the present invention.

Incidentally, the resin paste of the present invention may be used in the method of mounting the second semiconductor element 4b on the first semiconductor element 4a. However, the resin paste may run off the edge of the stacked element or bleeding may be caused so that there may be a problem posed for electrically bonding the first semiconductor element and the second semiconductor element or bonding the second semiconductor element and the substrate by wire bonding. Hence, it is preferable to use the resin film for adhesion when mounting the second semiconductor element.

Also, in the present invention, a stacked element having two or more semiconductor elements stacked may be formed according to functional design of the package. physical properties of an adhesion used for attaching the first semiconductor element 4a and the second semiconductor element 4b, and an adhesion used for attaching a semiconductor element following the second semiconductor element may not be particularly limited. Thus, a resin paste or resin film different from the present invention can be used. Herein, in the case that there may be a trouble caused in electrical bonding by wire bonding between the semiconductor element and the substrate due to the structure of the stacked element, it is preferable to use a resin film, which is less likely to run off the edge of the stacked element or cause bleeding.

Since in the area mount type semiconductor device mounting the stacked element of the present invention, stress imparted on the first semiconductor element 4a adjacent to the substrate 2 via the first adhesive layer 3a increases, it is necessary that an elastic modulus of a cured product of a resin paste or a resin film, used for adhesion between the first semiconductor element 4a and the substrate 2, at 260° C. is 1 MPa to 120 MPa.

Also, since the area mount type semiconductor device mounting a stacked element of the present invention mounts plural semiconductor elements, the required mounting condition becomes more severe than that of the area mount type semiconductor device mounting a semiconductor element. For example, there are problems as such that the semiconductor element becomes fragile when the thickness of the semiconductor element becomes thinner compared to that of the semiconductor device mounting single semiconductor element, stress increases due to increase of occupying area of the first semiconductor element with respect to the substrate area, or the like. However, the area mount type semiconductor device mounting a stacked element using the die bonding resin composition and the encapsulating resin composition obtained by the present invention is excellent in low stress property and solder crack resistance although the temperature when the area mount type semiconductor device mounted on a circuit board or the like is subject to solder bonding is 260° C., which is higher than conventional one. Such an area mount type semiconductor device mounting a stacked element of the present invention can correspond to further required downsizing and higher function of the semiconductor device.

Incidentally, the area mount type semiconductor device 8 of the present invention may be furnished with a solder ball 6 with the use of an encapsulating resin composition to be an encapsulating layer 7 by a general material and method according to the needs.

EXAMPLES

Examples of the present invention are hereinafter described. The scope of the present invention is not restricted by these examples. The compounding ratio is expressed by "part by weight".

(1) Forming of Resin Paste

The following components according to the compounding amount as shown in Table 1 were mixed at normal temperature. Then, the mixture was subject to mixing and kneading at room temperature by means of three rolls having a roll distance of 50 μm/30 μm for 5 times, thus obtained resin pastes P1 to P5. After each resin paste was defoamed in a vacuum chamber at 2 mmHg for 30 minutes, various properties of the obtained resin paste were evaluated in the following manner. The evaluation results are shown in Table 1.

<Material component>

The following material components were used.

Bisphenol A type epoxy resin (product name; Epikote 828, manufactured by Japan Epoxy Resins Co., Ltd.; epoxy equivalence: 190, hereafter referred as "BPA")

Hydrogenated bisphenol A type epoxy resin (product name: YX-8000, manufactured by Japan Epoxy Resins Co., Ltd.; epoxy equivalence: 206, hereafter referred as "hydrogenated BPA")

Cresyl glycidyl ether (product name: m,p-CGE, manufactured by Sakamoto Yakuhin Kogyo Co., Ltd.; epoxy equivalence: 165, hereafter referred as "m,p-CGE")

Diacrylate having a repeating unit of tetramethylene oxide represented by the following formula (1) (product name: NK ester A-PTMG 65, manufactured by Shin-Nakamura Chemical Co., Ltd.; hereafter referred as "A-PTMG 65"):

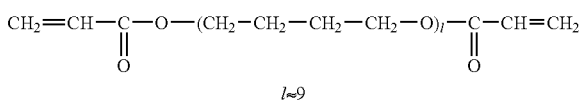

$$CH_2=CH-\underset{O}{\overset{\|}{C}}-O-(CH_2-CH_2-CH_2-CH_2-O)_l-\underset{O}{\overset{\|}{C}}-CH=CH_2 \quad (1)$$

$l \approx 9$

Diacrylate of propylene oxide propylene oxide adduct of bisphenol A represented by the following formula (2) (product name: LIGHT-ACRYLATE BP-4PA, manufactured by KYOEISHA CHEMICAL Co., LTD.; hereafter referred as "BP-4PA"):

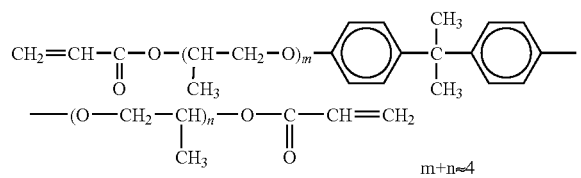

Formula (2):

$$CH_2=CH-\underset{O}{\overset{\|}{C}}-O-(CH-CH_2-O)_m-\text{[bisphenol A]}-(O-CH_2-CH)_n-O-\underset{O}{\overset{\|}{C}}-CH=CH_2$$

$m+n \approx 4$ 1,6-Hexanediol diacrylate (product name: LIGHT-ESTER 1,6HX-A, manufactured by KYOEISHA CHEMICAL Co., LTD.; hereafter referred as "1,6HX-A")

4,4'-Biphenol (product name: BIPHENOL, manufactured by Honshu Chemical Industry Co., Ltd.; hydroxyl group equivalence: 93, hereafter referred as "BP")

Dicyanediamide (hereafter referred as "DDA")

2-phenyl-4-methyl-5-hydroxymethyl imidazole (product name: Curezole 2P4MHZ, manufactured by Shikoku Chemicals Corporation; hereafter referred as "2P4MHZ")

Dicumyl peroxide (product name: PERCUMYL D, manufactured by NOF Corporation; hereafter referred as "initiator")

Silane coupling agent having a glycidyl group (product name: KBM-403E, manufactured by Shin-Etsu Chemical Co., Ltd.; hereafter referred as "epoxy silane")

Silver powder: a flake-like silver powder having an average particle diameter of 3 μm and a maximum particle diameter of 30 μm Silica: spherical silica having an average particle diameter of 2 μm and a maximum particle diameter of 20 μm

TABLE 1

| | | P1 | P2 | P3 | P4 | P5 |
|---|---|---|---|---|---|---|
| BPA | | 7.7 | 21.5 | | 15.4 | |
| Hydrogenated BPA | | 7.7 | 21.5 | | | |
| m,p-CGE | | 6.6 | 18.4 | | 6.6 | |
| A-PTMG65 | | | | 13.7 | | |
| BP-4PA | | | | | | 4.9 |
| 1,6HX-A | | | | 5.9 | | 14.7 |
| BP | | 2.2 | 6.1 | | 2.2 | |
| DDA | | 0.2 | 0.6 | | 0.2 | |
| 2P4MHZ | | 0.4 | 1.2 | | 0.4 | |
| Initiator | | | | 0.2 | | 0.2 |
| Epoxy silane | | 0.2 | 0.6 | 0.2 | 0.2 | 0.2 |
| Silver powder | | 75.0 | | 80.0 | 75.0 | 80.0 |
| Silica | | | 30.0 | | | |
| Viscosity | Pa·s | 20 | 16 | 18 | 22 | 23 |
| Elastic modulus 206° C. | MPa | 100 | 100 | 80 | 250 | 200 |

<Evaluation Method>

Viscosity: by means of an E type viscometer (3° cone), values were measured at 2.5 rpm at 25° C. just after producing the resin paste. A measured result having viscosity of 15 to 25 Pa·s was evaluated to have passed the criteria. A unit of viscosity is "Pa·s".

Elastic modulus: after the resin paste was applied on a Teflon (trade name) sheet to have a width of 4 mm, a length of about 50 mm and a thickness of 200 μm followed by curing for 30 minutes at 175° C. in an oven, the resin paste cured product was peeled from the Teflon (trade name) sheet. A sample of the obtained resin paste cured product having a length of 20 mm was measured by means of the dynamic viscoelasticity measurement at a frequency of 10 Hz by increasing temperature from −100° C. to 330° C. at a rate of 5° C./min. to calculate a storage modulus at 260° C.

(2) Forming of Resin Film

<Preparation of Resin Varnish for Die Bonding Resin Film>

The following components according to the compounding amount as shown in Table 2 were dissolved in MEK at normal temperature, thus obtained a resin varnish having resin solid content of 40%.

<Material Component>

The following material components were used.

An acrylic acid ester copolymer (N,N-dimethylacrylamide-acrylonitrile-ethyl acrylate-glycidyl methacrylate copolymer, Tg: 10° C., weight average molecular weight: 350,000; product name: SG-80HDR, manufactured by Nagase ChemteX Corporation; hereafter referred as "SG-80HDR")

A cresol novolac epoxy resin (product name: EOCN-1020-80, manufactured by NIPPON KAYAKU CO., LTD.; epoxy equivalence; 200 g/eq, melting point: 80° C.; hereafter referred as "EOCN-1020-80")

A cyanate resin (product name: L-10, manufactured by Vantico Ltd.; hereafter referred as "L-10")

Silane coupling agent (product name: KBM-403E, manufactured by Shin-Etsu Chemical Co., Ltd.; hereafter referred as "KBM-403E")

Silane coupling agent (product name: KBM-573, manufactured by Shin-Etsu Chemical Co., Ltd.; hereafter referred as "KBM-573")

Silane coupling agent (product name: KBM-5103, manufactured by Shin-Etsu Chemical Co., Ltd.; hereafter referred as "KBM-5103")

An ultraviolet curing resin (1,6-hexanediol dimethacrylate, product name: LIGHT-ESTER 1,6HX, manufactured by KYOEISHA CHEMICAL Co., LTD.; hereafter referred as "1,6HX")

A photopolymerization initiator (2,2-dimethoxy-diphenylethane-1-one, product name: IG651, manufactured by Chiba Specialty Chemicals, Inc.; hereafter referred as "IG651")

A curing accelerator (imidazole compound, product name: 1B2MZ, manufactured by Shikoku Chemicals Corporation; hereafter referred as "1B2MZ")

Solvent: methylethyl ketone; hereafter referred as "MEK"

silica: product name: SE-2050, manufactured by ADMATECHS Co., Ltd., an average particle diameter of 0.5 μm and a maximum particle diameter of 5 μm; hereafter referred as "SE-2050"

<Production of Die Bonding Resin Film>

After the above-mentioned resin varnish was coated on a polyethylene terephthalate film (product name: 38RL-07(L), manufactured by Oji Paper Co., Ltd.; thickness: 38 μm) as a substrate by means of a comma coater followed by drying at 70° C. for 10 minutes, the polyethylene terephthalate film as the substrate was peeled to obtain a die bonding resin film F1 to F3 having a thickness of 25 μm. Properties of the obtained die bonding resin films F1 to F3 were evaluated by the following manner. The evaluation results are shown in Table 2.

<Evaluation Method>

Elastic modulus: after the resin film was cured for 60 minutes at 180° C. in an oven, a sample of the cured resin film having a length of 20 mm was measured by means of the dynamic viscoelasticity measurement at a frequency of 10 Hz by increasing temperature from −100° C. to 330° C. at a rate of 5° C./min. to calculate a storage modulus at 260° C.

TABLE 2

| | | F1 | F2 | F3 |
|---|---|---|---|---|
| SG-80HDR | | 100 | 100 | 100 |
| EOCN-1020-80 | | 40 | 150 | |
| L-10 | | 10 | 30 | |
| 1B2MZ | | 3 | 3 | |
| KBM-403E | | 5 | 5 | |
| KBM-573 | | 1 | | |
| KBM-5103 | | | | 4 |
| 1,6HX | | 30 | 30 | 30 |
| IG651 | | 2 | 2 | 2 |
| SE-2050 | | | 250 | |
| Elastic modulus 206° C. | MPa | 6 | 135 | less than 1 |

(3) Forming of Encapsulating Resin Composition

The following components according to the compounding amount as shown in Table 3 were mixed in a mixer at normal temperature and were subject to mixing and kneading at 70 to 120° C. by means of two rolls having a roll distance of 1 mm. Thereafter, the mixture was cooled and crushed, thus obtained encapsulating epoxy resin compositions C1 to C5. Major material components and methods of evaluating properties used for the resin composition are as follows. The evaluation results are shown in Table 3.

<Materials Used for Encapsulating Resin Composition>

Epoxy resin 1: a biphenyl type epoxy resin (product name: YX4000K, manufactured by Japan Epoxy Resins Co., Ltd.; melting point: 105° C., epoxy equivalence: 185)

Epoxy resin 2: a phenolaralkyl type epoxy resin having a biphenylene structure (product name: NC3000P, manufactured by NIPPON KAYAKU CO., LTD.; softening point: 58° C., epoxy equivalence: 274)

Phenolic resin 1: a phenolaralkyl resin having a biphenylene structure (product name: MEH-7851SS, manufactured by MEIWA PLASTIC INDUSTRIES, LTD.; softening point: 65° C., hydroxyl group equivalence: 203)

Phenolic resin 2: a phenol novolac resin (softening point: 80° C., hydroxyl group equivalence: 105)

Fused spherical silica: average particle diameter of 20 μm

Coupling agent: γ-glycidylpropyl trimethoxy silane

Carbon black

Carnauba wax

Silicone gum: average particle diameter of 3 μm (product name: TOREFIL E-500, manufactured by Dow Corning Toray Co., Ltd.)

<Method of Evaluating Properties of Encapsulating Resin Composition>

Spiral flow: the encapsulating resin composition was injected into a mold for measuring spiral flow with reference to EMMI-1-66 under the condition of a mold temperature of 175° C., an injection pressure of 6.9 MPa and a curing time of 120 seconds with the use of a low pressure transfer molding machine to measure flow length. A measured unit was "cm".

TMA (thermo mechanical analysis): a cured product of the encapsulating resin composition having a size of 10 mm×4 mm×4 mm (thickness) was molded under the condition of a mold temperature of 175° C., an injection pressure of 6.9 MPa and a curing time of 90 seconds by means of a transfer molding machine. Then, after the cured product was subject to post-curing at 175° C. for 2 hours, TMA was performed by increasing temperature at a rate of 5° C./min. The thermal expansion coefficient at 60° C. was referred as α1 and the thermal expansion coefficient at 260° C. was referred as α2 in the obtained TMA curve. Also, the temperature of the point at the intersection of tangents of the TMA curve at 60° C. and 260° C. was referred as a glass transition temperature (Tg).

Transverse strength, flexural modulus (260° C.): with reference to JIS K 6911, a test sample of the encapsulating resin composition having a size of 80 mm×10 mm×4 mm was molded under the condition of a mold temperature of 175° C., an injection pressure of 6.9 MPa and a curing time of 90 seconds by means of a transfer molding machine. Then, after the test sample was subject to post-curing at 175° C. for 2 hours, transverse strength and flexural modulus were measured at 260° C.

TABLE 3

|  |  | C1 | C2 | C3 | C4 | C5 |
|---|---|---|---|---|---|---|
| Epoxy resin 1 |  | 5.8 | 2.9 | 6.4 | 5.5 | 4.5 |
| Epoxy resin 2 |  |  | 2.9 |  |  |  |
| Phenolic resin 1 |  | 2.1 | 5.2 | 2.3 | 0.9 |  |
| Phenolic resin 2 |  | 2.1 |  | 2.3 | 2.6 | 2.5 |
| Triphenyl phosphine |  | 0.2 | 0.2 | 0.2 | 0.2 | 0.2 |
| Spherical fused silica |  | 89.0 | 88.0 | 85.0 | 90.0 | 92.0 |
| Coupling agent |  | 0.3 | 0.3 | 0.3 | 0.3 | 0.3 |
| Carbon black |  | 0.3 | 0.3 | 0.3 | 0.3 | 0.3 |
| Carnauba wax |  | 0.2 | 0.2 | 0.2 | 0.2 | 0.2 |
| Silicone gum |  |  |  | 3.0 |  |  |
| Spiral flow | cm | 150 | 120 | 200 | 140 | 80 |
| α1 | ppm | 9 | 9 | 10 | 8 | 7 |
| α2 | ppm | 44 | 35 | 57 | 42 | 25 |
| Tg | °C. | 150 | 140 | 150 | 150 | 155 |

TABLE 3-continued

|  |  | C1 | C2 | C3 | C4 | C5 |
|---|---|---|---|---|---|---|
| Transverse strength 260° C. | MPa | 25 | 20 | 22 | 30 | 33 |
| Flexural modulus 260° C. | MPa | 1100 | 600 | 800 | 1400 | 2200 |

(4) Package Evaluation Method

Examples 1 to 19, Comparative Examples 1 to 19

In accordance with Tables 4 to 7, a package (semiconductor device) was assembled to measure various properties. The evaluation results are shown in Tables 4 to 7. Examples 1 to 8 and Comparative examples 1 to 11 are area mount type semiconductor devices mounting a semiconductor element, and Examples 9 to 19 and Comparative examples 9 to 19 are area mount type semiconductor devices mounting a stacked element.

The assembling method and evaluation method of the package are as follows.

<Method of Producing an Area Mount Type Semiconductor Device Mounting a Semiconductor Element>

(Method of Mounting Semiconductor Element by Resin Paste)

A semiconductor element (size: 9 mm×9 mm, thickness: 0.20 mm) was mounted on a bismaleimide triazine resin/glass cloth substrate (thickness: 0.36 mm; bismaleimide triazine resin of 155pFPBGA (product name, manufactured by MITSUBISHI GAS CHEMICAL COMPANY, INC); solder resist of PSR4000AUS (product name, manufactured by TAIYO INK MFG, CO., LTD.)) via the die bonding resin paste followed by curing in an oven, thus obtained the substrate mounting the semiconductor element. The curing condition of the die bonding resin paste was increasing temperature from room temperature to 175° C. in 30 minutes and maintaining 175° C. for 30 minutes. The thickness of the resin paste after curing was about 20 μm.

(Method of Mounting Semiconductor Element by Resin Film)

The reverse side (the side without IC) of a semiconductor wafer, wherein semiconductor elements are formed, having a thickness of 0.20 mm was attached on one side of the resin film to obtain the semiconductor water having the resin film bonded. Thereafter, a dicing film was attached on the resin film. The semiconductor wafer having the resin film and the dicing film bonded was diced so that the size of a semiconductor element was 9 mm×9 mm by means of a dicing saw with a spindle rotation of 30,000 rpm and a dicing speed of 50 mm/sec. Then, the semiconductor element was picked up by pushing the center of the semiconductor element from the backside of the dicing film where no resin film was attached to peel the dicing film from the resin film, thus obtained a semiconductor element having only the resin film bonded.

The semiconductor element having the resin film bonded was compressed to be die bonded on a bismaleimide triazine resin/glass cloth substrate (thickness: 0.36 mm; bismaleimide triazine resin of 155pFPBGA (product name, manufactured by MITSUBISHI GAS CHEMICAL COMPANY, INC); solder resist of PSR4000AUS (product name, manufactured by TAIYO INK MFG, CO., LTD.)) at 130° C. and 1 MPa for 1.0 second followed by curing in an oven, thus obtained a substrate mounting a semiconductor element. The curing condition of the resin film was increasing temperature from room temperature to 180° C. in 30 minutes and maintaining 180° C. for 60 minutes.

(Method of Molding Package by Encapsulating Resin Composition)

The substrate mounting the semiconductor element, wherein the semiconductor element is mounted on the substrate with the use of the resin paste or the resin film, was encapsulated and molded to have a size of 16 mm×16 mm and a thickness of 0.7 mm by an encapsulating resin composition under the condition of a mold temperature of 175° C., an injection pressure of 6.9 MPa and a curing time of 90 seconds by means of a transfer molding machine. Then, the substrate mounting the semiconductor element was subject to post-curing at 175° C. for 2 hours, thus obtained a sample of the area mount type semiconductor device (package) mounting a semiconductor element. Similarly, 2 sets of 16 samples of the semiconductor device were prepared.

<Method of Producing an Area Mount Type Semiconductor Device Mounting a Stacked Element>

(Method of Mounting Semiconductor Element by Resin Paste or Resin Film)

Except that the size of the semiconductor element was changed to 10 mm×10 mm with thickness of 100 μm, a first semiconductor element was mounted on a substrate similarly as the above-mentioned "Method of mounting semiconductor element by resin paste" or "Method of mounting semiconductor element by resin film" of "Method of producing an area mount type semiconductor device mounting a semiconductor element".

Separately, a second semiconductor element having a resin film attached for forming a stacked element was produced similarly as the above-mentioned "Method of mounting semiconductor element by resin film" except that the size of the semiconductor element was changed to 8 mm×8 mm with thickness of 100 μm. Herein, the second semiconductor element is same as the first semiconductor element.

Next, the second semiconductor element was compressed on the first semiconductor element in the same press condition as that in the above-mentioned "Method of mounting semiconductor element by resin film", thus obtained the substrate mounting the stacked element.

(Method of Molding Package by Encapsulating Resin Composition)

The substrate mounting the stacked element was encapsulated and molded to have a size of 16 mm×16 mm and a thickness of 0.7 mm followed by post-curing similarly as the above-mentioned "Method of molding package by encapsulating resin composition" of "Method of producing an area mount type semiconductor device mounting a semiconductor element". Thus obtained an area mount type semiconductor device (package) mounting a stacked element. Similarly, 2 sets of 16 samples of the semiconductor device were prepared.

<Evaluation Method of Reflow Crack Resistance>

One set of 16 samples was treated under excessive moisture under the environment of 60° C. and 60% relative humidity for 120 hours followed by IR reflow at 260° C. for 10 seconds. The other set of 16 samples was treated under excessive moisture under the environment of 85° C. and 60% relative humidity for 168 hours followed by IR reflow at 260° C. for 10 seconds. Each treated sample was observed by means of the scanning acoustic microscope detector to search the presence of inner crack and peeling at various interface. The samples having any of inner cracks and peeling at an interface were evaluated to be defective, and number of defective package (n) is shown as "n/16" in Tables 4 to 7.

TABLE 4

|  |  | Example |  |  |  |  |  |  |  |
|---|---|---|---|---|---|---|---|---|---|
|  |  | 1 | 2 | 3 | 4 | 5 | 6 | 7 | 8 |
| Resin paste | P1 | ○ |  |  |  | ○ |  |  |  |
|  | P2 |  | ○ |  |  |  | ○ |  |  |
|  | P3 |  |  | ○ |  |  |  | ○ |  |
| Resin film | F1 |  |  |  | ○ |  |  |  | ○ |
| Encapsulating resin composition | C1 | ○ | ○ | ○ | ○ |  |  |  |  |
|  | C2 |  |  |  |  | ○ | ○ | ○ | ○ |
| Reflow crack resistance (60° C./60%/120 hrs) |  | 0/16 | 0/16 | 0/16 | 0/16 | 0/16 | 0/16 | 0/16 | 0/16 |
| Reflow crack resistance (85° C./60%/168 hrs) |  | 2/16 | 2/16 | 1/16 | 0/16 | 1/16 | 0/16 | 0/16 | 0/16 |

TABLE 5

|  |  |  | Example |  |  |  |  |  |  |  |  |  |  |
|---|---|---|---|---|---|---|---|---|---|---|---|---|---|
|  |  |  | 9 | 10 | 11 | 12 | 13 | 14 | 15 | 16 | 17 | 18 | 19 |
| Substrate - First semiconductor element | Resin paste | P1 | ○ | ○ |  |  |  |  | ○ |  |  |  |  |
|  |  | P2 |  |  | ○ |  |  |  |  | ○ |  |  |  |
|  |  | P3 |  |  |  | ○ |  |  |  |  | ○ |  |  |
|  | Resin film | F1 |  |  |  |  | ○ | ○ |  |  |  | ○ | ○ |
| First semiconductor element - Second semiconductor element | Resin film | F1 | ○ |  |  |  | ○ | ○ | ○ | ○ | ○ | ○ |  |
|  |  | F2 |  | ○ | ○ |  |  |  | ○ |  |  |  | ○ |
| Encapsulating resin composition |  | C1 | ○ | ○ | ○ | ○ | ○ | ○ |  |  |  |  |  |
|  |  | C2 |  |  |  |  |  |  | ○ | ○ | ○ | ○ | ○ |
| Reflow crack resistance (60° C./60%/120 hrs) |  |  | 0/16 | 0/16 | 0/16 | 0/16 | 0/16 | 0/16 | 0/16 | 0/16 | 0/16 | 0/16 | 0/16 |
| Reflow crack resistance (85° C./60%/168 hrs) |  |  | 2/16 | 3/16 | 3/16 | 2/16 | 0/16 | 3/16 | 2/16 | 2/16 | 0/16 | 2/16 | 0/16 |

TABLE 6

| | | | Comparative example | | | | | | | | | | |
|---|---|---|---|---|---|---|---|---|---|---|---|---|---|
| | | | 1 | 2 | 3 | 4 | 5 | 6 | 7 | 8 | 9 | 10 | 11 |
| Resin paste | | P1 | | | ○ | ○ | ○ | | | | | | |
| | | p4 | ○ | | | | | | | | | | ○ |
| | | P5 | | ○ | | | | | | | | | |
| Resin film | | F1 | | | | | | ○ | ○ | ○ | | | |
| | | F2 | | | | | | | | | ○ | | |
| | | F3 | | | | | | | | | | ○ | |
| Encapsulating resin composition | | C1 | ○ | ○ | | | | | | | ○ | ○ | |
| | | C2 | | | | | | | | | | | |
| | | C3 | | | | ○ | | | ○ | | | | ○ |
| | | C4 | | | | | ○ | | | ○ | | | |
| | | C5 | | | | | | ○ | | | | | |
| Reflow crack resistance (60° C./60%/120 hrs) | | | 0/16 | 0/16 | 0/16 | 0/16 | 0/16 | 0/16 | 0/16 | 0/16 | 0/16 | 16/16 | 7/16 |
| Reflow crack resistance (85° C./60%/168 hrs) | | | 10/16 | 5/16 | 6/16 | 11/16 | 10/16 | 6/16 | 10/16 | 13/16 | 10/16 | 16/16 | 16/16 |

TABLE 7

| | | | Comparative example | | | | | | | |
|---|---|---|---|---|---|---|---|---|---|---|
| | | | 12 | 13 | 14 | 15 | 16 | 17 | 18 | 19 |
| Substrate - First semiconductor element | Resin paste | P4 | ○ | | | | | ○ | | |
| | | P5 | | ○ | | | | | | |
| | Resin film | F1 | | | | | | | | |
| | | F2 | | | | ○ | | | ○ | |
| | | F3 | | | ○ | | ○ | | | ○ |
| First semiconductor element - Second semiconductor element | Resin film | F1 | ○ | ○ | ○ | ○ | ○ | ○ | ○ | |
| | | F2 | | | | | | | | ○ |
| Encapsulating resin composition | | C1 | ○ | ○ | | ○ | ○ | | | |
| | | C2 | | | | | | ○ | | |
| | | C3 | | | ○ | | | | | |
| | | C4 | | | | | | | ○ | |
| | | C5 | | | | | | | | ○ |
| Reflow crack resistance (60° C./60%/120 hrs) | | | 3/16 | 2/16 | 2/16 | 4/16 | 16/16 | 2/16 | 6/16 | 9/16 |
| Reflow crack resistance (85° C./60%/168 hrs) | | | 12/16 | 10/16 | 5/16 | 7/16 | 16/16 | 9/16 | 10/16 | 14/16 |

INDUSTRIAL APPLICABILITY

The semiconductor device using the die bonding resin composition and the encapsulating resin composition obtained in the present invention is excellent in low stress property and solder crack resistance. Therefore, by applying the die bonding resin composition and the encapsulating resin composition which can be obtained by the present invention to a so-called area mount type semiconductor device, wherein a semiconductor element or a stacked element is mounted on one surface of a substrate such as a printed wiring board or a metal lead frame, and substantially only the surface mounting the semiconductor element or the stacked element is encapsulated with the use of a resin, reliability of the area mount type semiconductor device mounting a semiconductor element or a stacked element can be improved.

What is claimed is:

1. An area mount type semiconductor device comprising a substrate, and a semiconductor element mounted on a surface of the substrate via a die bonding resin composition, and substantially having only the surface of the substrate mounting the semiconductor element encapsulated with the use of an encapsulating resin composition, wherein an elastic modulus of a cured product of the die bonding resin composition at 260° C. is 1 MPa to 120 MPa, an elastic modulus of a cured product of the encapsulating resin composition at 260° C. is 400 MPa to 1,200 MPa, and a thermal expansion coefficient of the cured product of the encapsulating resin composition at 260° C. is 20 ppm to 50 ppm.

2. An area mount type semiconductor device according to claim 1, wherein the area mount type semiconductor device has a stacked element structure, in which one or more semiconductor elements as same as or different from said semiconductor element mounted on the surface of the substrate via the die bonding resin composition are further mounted on said semiconductor element.

3. An encapsulating resin composition used for an area mount type semiconductor device comprising a substrate, and a semiconductor element mounted on a surface of the substrate via a die bonding resin composition, and substantially having only the surface of the substrate mounting the semiconductor element encapsulated with the use of the encapsulating resin composition, wherein an elastic modulus of a cured product of the encapsulating resin composition at 260° C. is 400 MPa to 1,200 MPa, and a thermal expansion coefficient of the cured product of the encapsulating resin composition at 260° C. is 20 ppm to 50 ppm.

4. An encapsulating resin composition according to claim 3, wherein the area mount type semiconductor device has a stacked element structure, in which one or more semiconductor elements as same as or different from said semiconductor element mounted on the surface of the substrate via the die bonding resin composition are further mounted on said semiconductor element.

* * * * *